(12) United States Patent
Tsukamoto et al.

(10) Patent No.: US 10,038,316 B2
(45) Date of Patent: Jul. 31, 2018

(54) SEMICONDUCTOR DEVICE

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Katsuma Tsukamoto, Yokkaichi (JP); Yusuke Yano, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 267 days.

(21) Appl. No.: 14/911,438

(22) PCT Filed: Aug. 19, 2014

(86) PCT No.: PCT/JP2014/071605
§ 371 (c)(1),
(2) Date: Feb. 10, 2016

(87) PCT Pub. No.: WO2015/029833
PCT Pub. Date: Mar. 5, 2015

(65) Prior Publication Data
US 2016/0301202 A1    Oct. 13, 2016

(30) Foreign Application Priority Data
Aug. 30, 2013  (JP) .................................. 2013-179755

(51) Int. Cl.
*H02H 3/05*  (2006.01)
*H02H 3/20*  (2006.01)
(Continued)

(52) U.S. Cl.
CPC .......... *H02H 3/207* (2013.01); *H02H 1/0007* (2013.01); *H03K 17/0822* (2013.01);
(Continued)

(58) Field of Classification Search
USPC ....................................................... 361/93.1
See application file for complete search history.

(56) References Cited

U.S. PATENT DOCUMENTS 5,473,276 A * 12/1995 Throngnumchai ..... H01L 23/62
                                                           327/432
6,208,041 B1 * 3/2001 Majumdar ........... H03K 17/122
                                                           307/113
(Continued)

FOREIGN PATENT DOCUMENTS

EP    1 420 257 A2    5/2004
JP    H11-150461      6/1999
(Continued)

OTHER PUBLICATIONS

Jul. 1, 2016 Extended European Search Report issued in European Patent Application No. 14840936.0.
(Continued)

*Primary Examiner* — Ronald W Leja
(74) *Attorney, Agent, or Firm* — Oliff PLC

(57) ABSTRACT

A semiconductor device is provided in which burning of a semiconductor element can be prevented without incorporating a fuse. The semiconductor device, which includes a plurality of semiconductor elements that are connected in parallel between a direct current power source and a load, is configured to simultaneously turn ON or OFF the plurality
(Continued)

of semiconductor elements. The semiconductor device includes a voltage detection means for detecting a voltage value across a fixed potential and a connection node for the plurality of semiconductor elements and for the load, a determining means for determining, if the semiconductor elements are OFF, whether or not a voltage value detected by the voltage detection means is higher than a predetermined voltage value; and a means for turning the plurality of semiconductor elements ON when the unit determines that the detected voltage value is higher than the predetermined voltage value.

3 Claims, 3 Drawing Sheets

(51) Int. Cl.
| | | |
|---|---|---|
| H03K 17/082 | (2006.01) | |
| H03K 17/10 | (2006.01) | |
| H03K 17/12 | (2006.01) | |
| H02H 1/00 | (2006.01) | |

(52) U.S. Cl.
 CPC ......... *H03K 17/102* (2013.01); *H03K 17/122* (2013.01); *H03K 2217/0063* (2013.01)

(56) References Cited

U.S. PATENT DOCUMENTS

| | | | | |
|---|---|---|---|---|
| 6,353,309 B1* | 3/2002 | Ootani | ............... | G05F 1/575 323/282 |
| 9,280,165 B2* | 3/2016 | Fujii | ............... | B60R 16/03 |
| 2004/0129864 A1* | 7/2004 | Yamagishi | ............... | H01L 31/125 250/214 R |
| 2004/0136129 A1* | 7/2004 | Amada | ............... | G01R 31/282 361/82 |
| 2008/0150483 A1 | 6/2008 | Morita et al. | | |
| 2011/0121752 A1* | 5/2011 | Newman, Jr. | ............... | H05B 39/04 315/291 |
| 2011/0279985 A1* | 11/2011 | Horman | ............... | H03K 17/18 361/748 |
| 2012/0033471 A1* | 2/2012 | Newman, Jr. | ............... | H05B 33/0815 363/126 |
| 2012/0187774 A1* | 7/2012 | Tabatabaei | ............... | H02J 7/0019 307/109 |
| 2013/0009491 A1* | 1/2013 | Hafner | ............... | H02M 1/092 307/113 |
| 2013/0170263 A1* | 7/2013 | Newman, Jr. | ............... | H02M 7/06 363/126 |
| 2013/0278300 A1* | 10/2013 | Domingo | ............... | H03K 17/0822 327/109 |
| 2014/0168840 A1* | 6/2014 | Hafner | ............... | H03K 17/107 361/86 |
| 2014/0340124 A1* | 11/2014 | Hirler | ............... | H03K 17/168 327/108 |

FOREIGN PATENT DOCUMENTS

| | | |
|---|---|---|
| JP | 2003-158447 A | 5/2003 |
| JP | 2005-039385 | 2/2005 |
| JP | 2008-182872 A | 8/2008 |
| JP | 4593518 B2 | 12/2010 |
| JP | 2013-102423 A | 5/2013 |
| WO | 2010/087745 A1 | 8/2010 |
| WO | 2012/175109 A1 | 12/2012 |

OTHER PUBLICATIONS

Craig G. Wester, "High Impedance Fault Detection on Distribution Systems", Rural Electric Power Conference, 1998, Papers Presented at the 42nd Annual Conference, St. Louis, MO, USA, Apr. 26-28, 1998.

Nov. 18, 2014 Search Report issued in International Patent Application No. PCT/JP2014/071605.

* cited by examiner

SEMICONDUCTOR DEVICE

Exemplary embodiments relate to a semiconductor device that includes a plurality of semiconductor elements connected between a direct current power source and a load, and is configured such that the plurality of semiconductor elements are simultaneously turned ON or OFF.

BACKGROUND

In a conventional semiconductor device, if the semiconductor element (e.g. a MOFSET (a metal-oxide-semiconductor field-effect transistor)) that is being used as a semiconductor relay shorts out, the semiconductor element itself is prevented from burning and an electrical line and a load on the downstream side are protected by cutting off the electric current with a fuse mechanism provided within the semiconductor element package.

There are many cases in which a plurality of semiconductor elements (semiconductor relays) connected in parallel are used to increase the current capacity. There are also many cases in which a pair of semiconductor elements connected in anti-series are used such that a counter-current does not pass through via a body diode (a parasitic diode).

Patent Document 1 discloses a semiconductor device with an incorporated fuse including a conductor pattern, a fuse mechanism and a wire. The conductor pattern is formed adjacent to the semiconductor device on a circuit board and includes a groove formed in its upper surface. The fuse mechanism includes an electrode formed with a metal material with a low melting point in an area that includes an upper surface of the pattern and the edge at one end of the groove. One end of the wire is connected to an electrode of the semiconductor device and the other end is connected to the electrode of the fuse mechanism. When an overcurrent flows through the pattern, the electrode of the fuse mechanism melts and flows into the groove, the other end of the wire is disconnected from the electrode, and the semiconductor device and the pattern are cut off from each other.

CITATION LIST

Patent Documents

Patent Document 1: JP 4593518B

SUMMARY

In a semiconductor device such as that described above, providing a fuse mechanism within the semiconductor element package increases the on-resistance, and therefore there is the issue of the performance of the semiconductor element decreasing as well as the cost of parts increasing.

Exemplary embodiments resolve the issues described above, and an object thereof is to provide a semiconductor device in which burning of the semiconductor element can be prevented without incorporating a fuse.

A semiconductor device according to an exemplary embodiment includes a plurality of semiconductor elements connected in parallel between a direct current power source and a load. The semiconductor device is configured to turn the plurality of semiconductor elements simultaneously ON or OFF, and further includes a voltage detector that detects a voltage value between a fixed potential and a connection node, the connection node being arranged between the plurality of semiconductor elements and the load; a means for determining (if the plurality of semiconductor elements are OFF) whether or not a voltage value detected by the voltage detector is higher than a predetermined voltage value; and a means for turning ON the plurality of semiconductor elements when the determining means determines that the detected voltage value is higher than the predetermined voltage value.

In this semiconductor device, the plurality of semiconductor elements are connected in parallel between the direct current power source and the load, and the semiconductor device is configured such that the plurality of semiconductor elements are simultaneously turned ON or OFF. The voltage detector detects the voltage value between the fixed potential and the connection node between the plurality of semiconductor elements and the load. If the plurality of semiconductor elements are OFF, it is determined whether or not the voltage value detected by the voltage detector is higher than a predetermined voltage value, and the plurality of semiconductor elements are turned ON when it is determined that the detected voltage value is higher than the predetermined voltage value.

A semiconductor device according to another exemplary embodiment includes two semiconductor elements connected in anti-series between a direct current power source and a load, the semiconductor device being configured to turn the two semiconductor elements simultaneously ON or OFF, the semiconductor device further including a voltage detector for detecting a voltage value between a connection node of the two semiconductor elements and a fixed electric potential; a means for determining, if the two semiconductor elements are OFF, which of a voltage value detected by the voltage detector and a predetermined voltage value is higher; and a means for turning the two semiconductor elements ON if the determining means determines that the detected voltage value is higher than the predetermined voltage value.

In this semiconductor device, two semiconductor elements are connected in anti-series between the direct current power source and the load, and the semiconductor device is configured such that the two semiconductor elements are simultaneously turned ON or OFF. The voltage detector detects the voltage value between the connection node for the two semiconductor elements and the fixed potential. If the two semiconductor elements are OFF, it is determined which of the voltage value detected by the voltage detector and the predetermined voltage value is higher, and the two semiconductor elements are turned ON when it is determined that the detected voltage value is higher than the predetermined voltage value.

A semiconductor device according to an exemplary embodiment includes two semiconductor elements connected in anti-series between a direct current power source and a load, the semiconductor device being configured to turn the two semiconductor elements simultaneously ON or OFF, the semiconductor device further including a voltage detector for detecting a voltage value between a connection node of the two semiconductor elements and a fixed electric potential; a means for determining, if the two semiconductor elements are OFF, which of a voltage value detected by the voltage detector and a predetermined voltage value is higher; and a means for turning the two semiconductor elements ON if the determining means determines that the detected voltage value is lower than the predetermined voltage value.

In this semiconductor device, two semiconductor elements are connected in anti-series between the direct current power source and the load, and the semiconductor device is configured such that the two semiconductor elements are simultaneously turned ON or OFF. The voltage detection means detects the voltage value between the connection node for the two semiconductor elements and the fixed potential. If the two semiconductor elements are OFF, it is determined which of the voltage value detected by the voltage detection means and the predetermined voltage value is higher and which is lower, and the two semiconductor elements are turned ON when it is determined that the detected voltage value is lower than the predetermined voltage value.

With a semiconductor device according to exemplary embodiments, it is possible to realize a semiconductor device in which burning of the semiconductor elements can be prevented without incorporating a fuse.

DETAILED DESCRIPTION OF EMBODIMENTS

Exemplary embodiments will be described below.

Exemplary Embodiment 1

Figure 1:
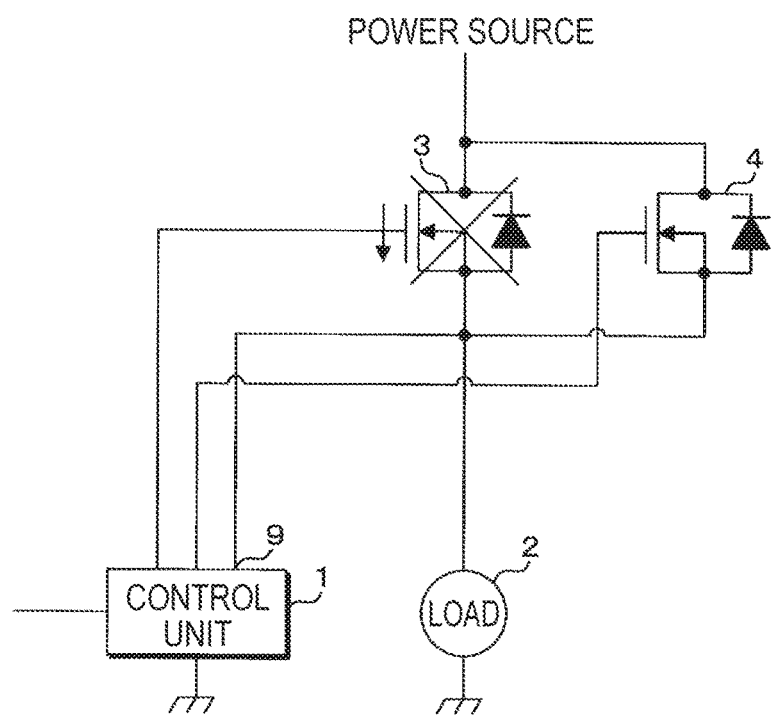
FIG. 1 is a circuit diagram showing a configuration of main parts of an embodiment of a semiconductor device according to an exemplary embodiment.

FIG. 1 is a circuit diagram showing a configuration of main parts of Exemplary Embodiment 1 of a semiconductor device.

In this semiconductor device, N-channel MOSFETs (semiconductor elements) 3 and 4 are connected in parallel between a direct current power source and a load 2. The drains of the FETs 3 and 4 are connected to the direct current power source, and the sources of the FETs 3 and 4 are each connected to one terminal of the load 2. The other terminal of the load 2 is grounded (connected to a fixed potential).

The voltage value of the sources of the FETs 3 and 4 (one terminal of the load 2) is detected by a voltage detection means 9 incorporated into a control unit 1. The FETs 3 and 4 each have a body diode (parasitic diode), which is formed in anti-parallel.

The gates of the FETs 3 and 4 are connected to the control unit 1, which includes a microcomputer, and the control unit 1 simultaneously turns the FETs 3 and 4 ON or OFF.

In a semiconductor device configured in such a manner, the control unit 1 simultaneously turns the FETs 3 and 4 ON upon receiving an instruction signal to drive the load 2, and simultaneously turns the FETs 3 and 4 OFF upon receiving an instruction signal to stop the load 2.

If the FETs 3 and 4 are OFF, the voltage value detected by the voltage detection means 9 is zero, as long as the FETs 3 and 4 are functioning normally.

As shown for example in FIG. 1, if the FETs 3 and 4 are OFF, when the FET 3 shorts out, its on-resistance exceeds that which is normal and the FET 3 becomes semiconductive, and the voltage value detected by the voltage detection means 9 increases.

The control unit (means for determining, means for turning ON) 1 determines whether or not the voltage value detected by the voltage detection means 9 is higher than a predetermined voltage value, and turns the FETs 3 and 4 ON when the detected voltage value is determined to be higher than the predetermined voltage value.

Figure 2:
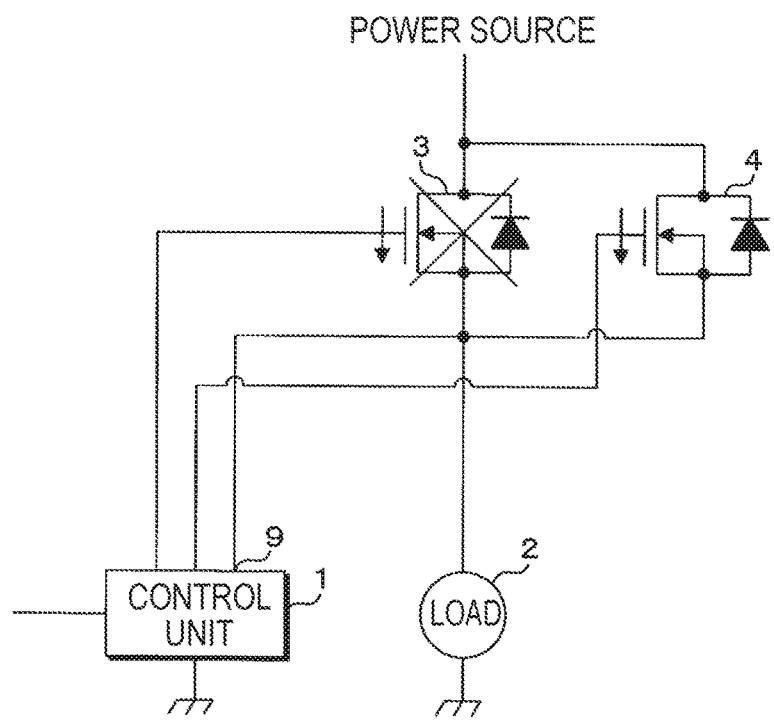
FIG. 2 is an illustrative diagram for illustrating an example of an operation of the semiconductor device shown in FIG. 1.

Accordingly, as shown in FIG. 2, an electric current also flows through the FET 4, the electric current flowing through the shorted out FET 3 decreases, the amount of heat generated by the FET 3 can be mitigated and burning can be prevented, and thus the fail-safe functionality is realized.

Also, the load 2 is in a state in which it is being driven in an incomplete manner due to the FET 3 being semiconductive, and therefore a new burden on the load 2 is small even if the FETs 3 and 4 are ON.

Note that in Embodiment 1 described above, an example was described in which two semiconductor elements are connected in parallel, but also three or more semiconductor elements that are connected in parallel can be operated similarly.

Also, in Embodiment 1 described above, N-channel MOSFETs 3 and 4 are used as the semiconductor elements, but the semiconductor elements can be similarly operated are P-channel MOSFET are used.

Exemplary Embodiment 2

Figure 3:
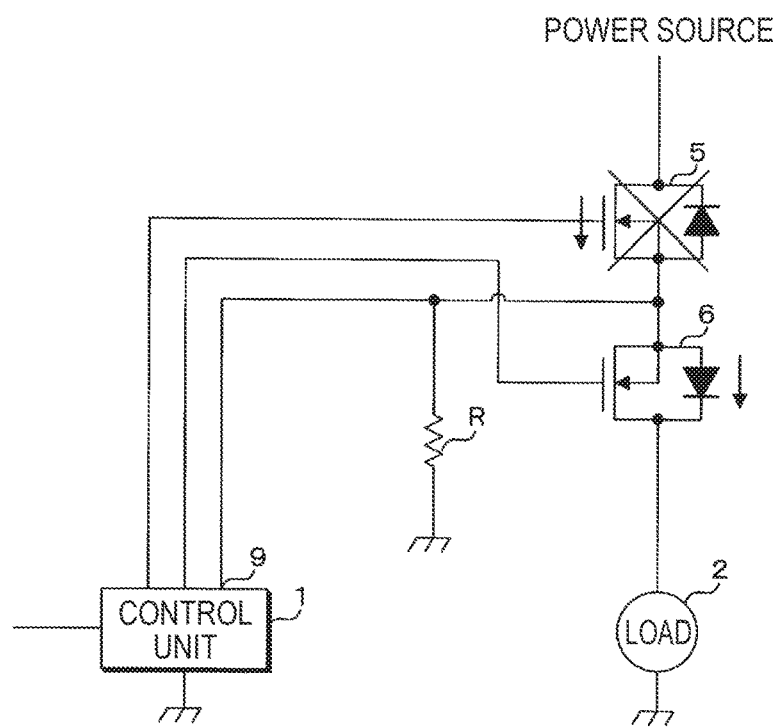
FIG. 3 is a circuit diagram showing a configuration of main parts of an embodiment of a semiconductor device according to an exemplary embodiment.

FIG. 3 is a circuit diagram showing a configuration of main parts of Exemplary Embodiment 2 of a semiconductor device. In this semiconductor device, N-channel MOSFETs (semiconductor elements) 5 and 6 are connected in anti-series between the direct current power source and the load 2. The drain of the FET 5 is connected to the direct current power source, the sources of the FETs 5 and 6 are connected to each other, the drain of the FET 6 is connected to one terminal of the load 2, and the other terminal of the load 2 is grounded (connected to the fixed potential).

A resistor R is connected between the sources of the FETs 5 and 6 and a grounded terminal, and the voltage value across the ends of the resistor R is detected by the voltage detection means 9 incorporated into the control unit 1. The FETs 5 and 6 each have a body diode (parasitic diode) formed in anti-parallel.

The control unit 1, which includes a microcomputer, is connected to the gates of the FETs 5 and 6, and the control unit 1 simultaneously turns the FETs 5 and 6 ON or OFF.

Note that the load 2 may also be a subordinate electric power source, such as a battery, in which case electricity from the drain of the FET 5 is diverged to another load, and the FETs 5 and 6 are turned ON when the subordinate electric power source is charged or discharged, switching between the electric power source and the subordinate electric power source.

In a semiconductor device configured in such a manner, the control unit 1 simultaneously turns the FETs 5 and 6 ON upon receiving an instruction signal to drive the load 2, and simultaneously turns the FETs 5 and 6 OFF upon receiving an instruction signal to stop the load 2.

If the FETs 5 and 6 are OFF, the voltage value detected by the voltage detection means 9 is zero, as long as the FETs 5 and 6 are functioning normally.

As shown for example in FIG. 3, if the FETs 5 and 6 are OFF, when the FET 5 shorts out, its on-resistance exceeds that which is normal and the FET 5 becomes semiconductive, an electric current flows through the body diode of the FET 6 and the resistor R, and the voltage value detected by the voltage detection means 9 increases. However, since the resistor R is made large, most of the electric current cannot pass through it.

The control unit (means for determining, means for turning ON) 1 determines whether or not the voltage value detected by the voltage detection means 9 is higher than the predetermined voltage value, and turns the FETs 5 and 6 ON when the detected voltage value is determined to be higher than a predetermined voltage value.

Figure 4:
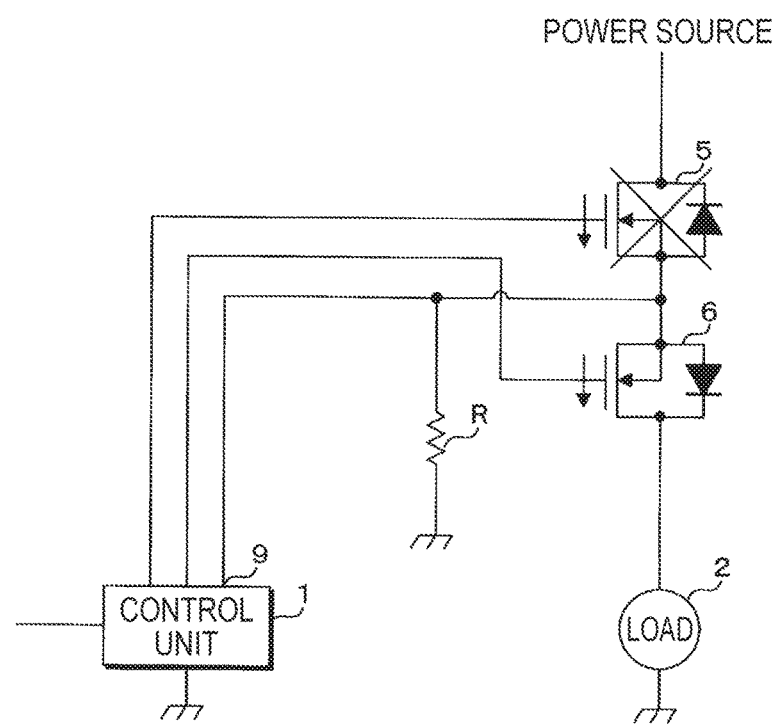
FIG. 4 is an illustrative diagram for illustrating an example of an operation of the semiconductor device shown in FIG. 3.

Accordingly, as shown in FIG. 4, an electric current also flows through the FET 6, the electric current flowing through the body diode of the FET 6 decreases, the amount of heat generated by the FET 6 can be mitigated and burning can be prevented, and thus the fail-safe functionality is realized.

Note that if a plurality of pairs of FETs 5 and 6 are connected in anti-series, by turning the FETs 5 and 6 ON, the electric current flowing through the FET 5 that has shorted out also decreases and the amount of heat generated by the FET 5 can also be mitigated.

Also, the load 2 is in a state in which it is driven in an incomplete manner due to the semiconductive FET 5 and the body diode of the FET 6 being conductive, and therefore a new burden on the load 2 is small, even if the FETs 5 and 6 are ON.

Exemplary Embodiment 3

Figure 5:
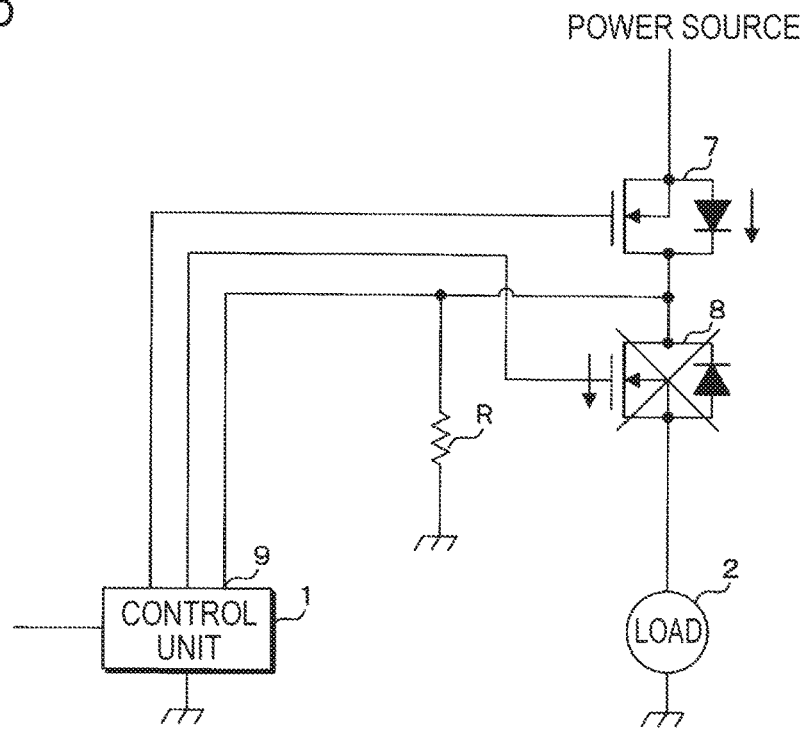
FIG. 5 is a circuit diagram showing a configuration of main parts of an embodiment of a semiconductor device according to an exemplary embodiment.

FIG. 5 is a circuit diagram showing a configuration of main parts of Exemplary Embodiment 3 of a semiconductor device. In this semiconductor device, N-channels MOSFET (semiconductor elements) 7 and 8 are connected in anti-series between the direct current power source and the load 2. The source of the FET 7 is connected to the direct current power source and the drains of the FETs 7 and 8 are connected to each other, the source of the FET 8 is connected to one terminal of the load 2, and the other terminal of the load 2 is grounded (connected to a fixed potential).

A resistor R is connected between the drains of the FETs 7 and 8 and the grounded terminal, and the voltage value across the ends of the resistor R is detected by the voltage detection means 9 incorporated into the control unit 1. The FET 7s and 8 each have a body diode (parasitic diode) formed in anti-parallel.

The control unit 1, which includes a microcomputer, is connected to the gates of the FETs 7 and 8, and the control unit 1 simultaneously turns the FETs 7 and 8 ON or OFF.

Note that the load 2 may also be a subordinate electric power source, such as a battery, in which case electricity from the source of the FET 7 is diverged to another load, and the FETs 7 and 8 are turned ON when the subordinate electric power source is charged or discharged, switching between the electric power source and the subordinate electric power source.

In a semiconductor device configured in such a manner, the control unit 1 simultaneously turns the FETs 7 and 8 ON upon receiving an instruction signal to drive the load 2, and simultaneously turns the FETs 7 and 8 OFF upon receiving an instruction signal to stop the load 2.

If the FETs 7 and 8 are OFF, because the body diode of the FET 7 is conductive, the voltage value detected by the voltage detection means 9 is approximately the voltage value of the power source, as long as the FETs 7 and 8 are functioning normally. However, since the resistor R is made large, most of the electric current cannot pass through it.

As shown for example in FIG. 5, if the FETs 7 and 8 are OFF, when the FET 8 shorts out, its on-resistance exceeds that which is normal and the FET 8 becomes semiconductive, an electric current flows to the load 2 through the body diode of the FET 7, and the voltage value detected by the voltage detection means 9 decreases. However, as described above, most of the electric current cannot pass through the resistor R.

The control unit (means for determining, means for turning ON) 1 determines whether or not the voltage value detected by the voltage detection means 9 is lower than the predetermined voltage value, and turns the FETs 7 and 8 ON when the detected voltage value is determined to be lower than the predetermined voltage value.

Figure 6:
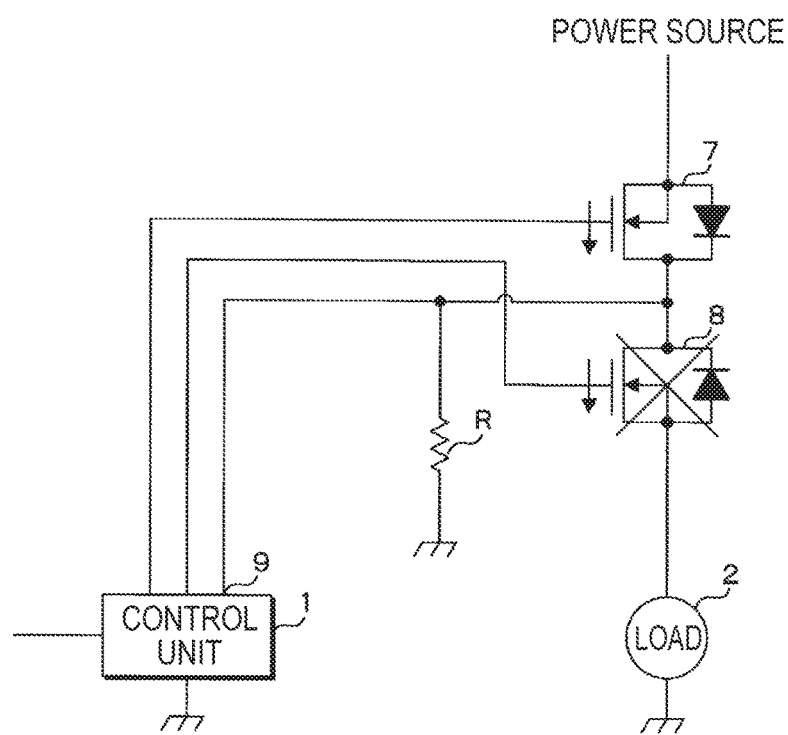
FIG. 6 is an illustrative diagram for illustrating an example of an operation of the semiconductor device shown in FIG. 5.

Accordingly, as shown in FIG. 6, electric current also flows through the FET 7, the electric current flowing through the body diode of the FET 7 decreases, the amount of heat generated by the FET 7 can be mitigated and burning can be prevented, and thus the fail-safe functionality is realized.

Note that if a plurality of pairs of the FETs 7 and 8 connected in anti-series are connected in parallel, by turning the FETs 7 and 8 ON, the electric current flowing through the FET 8 that has shorted out also decreases and the amount of heat generated by the FET 8 can also be mitigated.

Also, the load 2 is in a state in which it is driven in an incomplete manner due to the FET 8 being semiconductive and the body diode of the FET 7 being conductive, and therefore a new burden on the load 2 is small even if the FETs 7 and 8 are turned ON.

Note that in Embodiments 2 and 3 described above, an example was described in which a pair of two semiconductor elements were connected in anti-series, but semiconductor elements can be similarly operated even if two or more pairs of two semiconductor elements connected in anti-series are connected in parallel.

Also, in Embodiments 2 and 3, N-channel MOSFETs are used as the semiconductor elements, but the semiconductor element can be similarly operated in a case in which P-channel MOSFETs are used.

Exemplary embodiments can be used for a semiconductor device that includes a plurality of semiconductor elements connected in parallel between a direct current power source and a load, or two semiconductor elements connected in anti-series between a direct current power source and a load, and that is configured such that the semiconductor elements can be simultaneously turned ON and OFF.

The invention claimed is:

1. A semiconductor device comprising a plurality of semiconductor elements connected in parallel between a direct current power source and a load, the semiconductor device being configured to turn the plurality of semiconductor elements simultaneously ON or OFF, the semiconductor device further comprising:
   a voltage detector configured to detect a voltage value between a fixed potential and a connection node, the connection node being arranged between the plurality of semiconductor elements and the load;
   a control unit configured to perform the following steps:
   if the plurality of semiconductor elements are OFF, determining whether a voltage value detected by the voltage detector is higher than a predetermined voltage value; and
   turning ON the plurality of semiconductor elements when the control unit determines that the detected voltage value is higher than the predetermined voltage value.

2. A semiconductor device comprising two semiconductor elements connected in anti-series between a direct current power source and a load, the semiconductor device being configured to turn the two semiconductor elements simultaneously ON or OFF, the semiconductor device further comprising:
- a voltage detector configured to detect a voltage value between a connection node of the two semiconductor elements and a fixed electric potential;
- a control unit configured to perform the following steps:
- if the two semiconductor elements are OFF, determining which of a voltage value detected by the voltage detector and a predetermined voltage value is higher; and
- turning the two semiconductor elements ON if the control unit determines that the detected voltage value is higher than the predetermined voltage value.

3. A semiconductor device comprising two semiconductor elements connected in anti-series between a direct current power source and a load, the semiconductor device being configured to turn the two semiconductor elements simultaneously ON or OFF, the semiconductor device further comprising:
- a voltage detector configured to detect a voltage value between a connection node of the two semiconductor elements and a fixed electric potential;
- a control unit configured to perform the following steps:
- if the two semiconductor elements are OFF, determining which of a voltage value detected by the voltage detector and a predetermined voltage value is higher; and
- turning the two semiconductor elements ON if the control unit determines that the detected voltage value is lower than the predetermined voltage value.

* * * * *